(12) United States Patent
Yaegashi

(10) Patent No.: US 10,539,876 B2
(45) Date of Patent: Jan. 21, 2020

(54) PATTERN FORMING METHOD

(71) Applicant: Tokyo Electron Limited, Tokyo (JP)

(72) Inventor: Hidetami Yaegashi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 175 days.

(21) Appl. No.: 15/381,321

(22) Filed: Dec. 16, 2016

(65) Prior Publication Data

US 2017/0184972 A1     Jun. 29, 2017

(30) Foreign Application Priority Data

Dec. 24, 2015   (JP) ................................ 2015-251374

(51) Int. Cl.
    *G03F 7/30*          (2006.01)

(52) U.S. Cl.
    CPC ....................... *G03F 7/30* (2013.01)

(58) Field of Classification Search
    CPC ............... G03F 7/30; G03F 7/40; G03F 7/405
    USPC .................................................. 430/436, 331
    See application file for complete search history.

(56) References Cited

U.S. PATENT DOCUMENTS

| | | | | |
|---|---|---|---|---|
| 5,064,748 A | * | 11/1991 | Bobbio | ............... G03F 7/091 |
| | | | | 216/87 |
| 9,329,471 B1 | * | 5/2016 | Ning | ................... G06F 17/5081 |
| 2006/0003266 A1 | * | 1/2006 | Yi | ....................... H01L 27/3283 |
| | | | | 430/320 |
| 2012/0028195 A1 | * | 2/2012 | Wu | ....................... C09D 183/08 |
| | | | | 430/323 |
| 2012/0223428 A1 | * | 9/2012 | Pendse | ................... H01L 24/16 |
| | | | | 257/737 |

FOREIGN PATENT DOCUMENTS

| | | |
|---|---|---|
| JP | 08-234451 A | 9/1996 |
| JP | 2000-199953 A | 7/2000 |
| JP | 2005-181758 A | 7/2015 |
| JP | 2015-127796 A | 7/2015 |

* cited by examiner

*Primary Examiner* — Daborah Chacko-Davis
(74) *Attorney, Agent, or Firm* — Abelman, Frayne & Schwab

(57) ABSTRACT

Provided is a method for forming a hole pattern in a resist film. The method includes forming a resist film on a workpiece; exposing the resist film using a bright field mask; removing an unexposed portion of the resist film by supplying a first developer to the resist film and performing a negative development after the exposing the resist film; modifying a sidewall portion of the resist film after the removing the unexposed portion of the resist film; and removing an exposed portion of the resist film by supplying a second developer to the resist film and performing a positive development after the modifying the sidewall portion of the resist film. The modifying the sidewall portion of the resist film is a processing of reducing solubility of the sidewall portion of the resist film in the second developer.

7 Claims, 7 Drawing Sheets

PATTERN FORMING METHOD

CROSS-REFERENCE TO RELATED APPLICATIONS

This application is based on and claims priority from Japanese Patent Application No. 2015-251374 filed on Dec. 24, 2015 with the Japan Patent Office, the disclosure of which is incorporated herein in its entirety by reference.

TECHNICAL FIELD

The present disclosure relates to a pattern forming method.

BACKGROUND

Conventionally, a method of forming a resist pattern has been known, which includes exposing a resist film using an exposure mask, performing a positive development, and then performing a negative development to leave an intermediate exposed portion formed between an exposed portion and an unexposed portion (see, e.g., Japanese Patent Laid-Open Publication No. 2000-199953). This method may form a resist pattern having a narrower pitch than the pattern of the exposure mask.

SUMMARY

According to an aspect, the present disclosure provides a method for forming a hole pattern in a resist film. The method includes: forming a resist film on a workpiece; exposing the resist film using a bright field mask; removing an unexposed portion of the resist film by supplying a first developer to the resist film and performing a negative development after the exposing the resist film; modifying a sidewall portion of the resist film after the removing the unexposed portion of the resist film; and removing an exposed portion of the resist film by supplying a second developer to the resist film and performing a positive development after the modifying the sidewall portion of the resist film. The modifying the sidewall portion of the resist film includes a processing of reducing solubility of the sidewall portion of the resist film in the second developer.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1A:
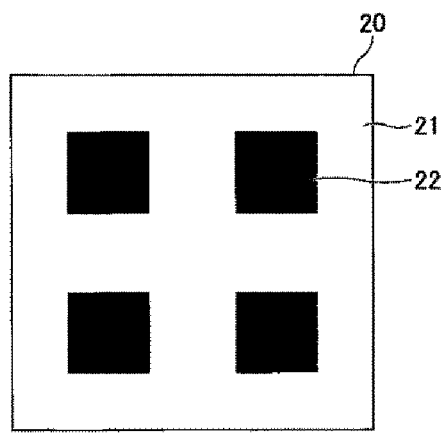
FIGS. 1A and 1B are views each illustrating an exposure mask.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

With the above-mentioned method, it is difficult to form a minute hole pattern. This is because, when a hole pattern is formed using the method, a dark field mask is used as an exposure mask, but an optical image contrast of the dark field mask is not sufficiently obtained.

Thus, when a minute hole pattern is formed, it may be advantageous in some cases to expose the resist film using a bright field mask that is excellent in optical image contrast to the dark field mask, perform a negative development, and then perform a positive development.

However, when exposing the resist film using a bright field mask, performing a negative development, and then performing a positive development, an intermediate exposed portion is considerably dissolved during the negative development after the exposure. Thus, a desired pattern may not remain. As a result, a minute hole pattern may not be formed. This is because the negative development tends to easily dissolve the intermediate exposed portion as compared with the positive development.

Accordingly, in an aspect, an object of the present disclosure is to provide a pattern forming method capable of forming a minute hole pattern.

In order to achieve the object, the present disclosure according to an aspect provides a method for forming a hole pattern in a resist film. The method includes forming a resist film on a workpiece; exposing the resist film using a bright field mask; removing an unexposed portion of the resist film by supplying a first developer to the resist film and performing a negative development after the exposing the resist film; modifying a sidewall portion of the resist film after the removing the unexposed portion of the resist film; and removing an exposed portion of the resist film by supplying a second developer to the resist film and performing a positive development after the modifying the sidewall portion of the resist film. The modifying the sidewall portion of the resist film includes a processing of reducing solubility of the sidewall portion of the resist film in the second developer.

In the above-described method, the modifying the sidewall portion of the resist film includes a processing of causing the sidewall portion of the resist film to react with ammonia.

In the above-described method, the modifying the sidewall portion of the resist film includes a processing of causing the sidewall portion of the resist film to react with an organic base.

In the above-described method, the modifying the sidewall portion of the resist film includes a processing of causing the sidewall portion of the resist film to react with an amino group-containing silane coupling agent.

The above-described method further includes heating the resist film between the exposing the resist film and the removing the unexposed portion of the resist film.

According to the pattern forming method of the present disclosure, a minute hole pattern may be formed.

Hereinafter, an exemplary embodiment of the present disclosure will be described with reference to the accompanying drawings. In the present specification and drawings, components having substantially the same functional configurations will be denoted by the same symbols, and the overlapping descriptions thereof will be omitted.

The pattern forming method of the exemplary embodiment is to form a minute hole pattern using a dual tone development (DTD) method. The DTD method is to form a minute hole pattern by exposing a resist film using an exposure mask, and performing a negative development and a positive development to leave an intermediate exposed portion formed between an exposed portion and an unexposed portion. The negative development is to selectively dissolve and remove the unexposed portion of the resist film by supplying a developer to the resist film. The positive development is to selectively dissolve and remove the exposed portion of the resist film by supplying a developer to the resist film.

Figure 1B:
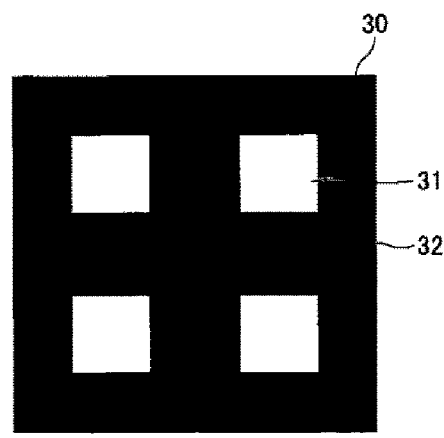
Figure 2:
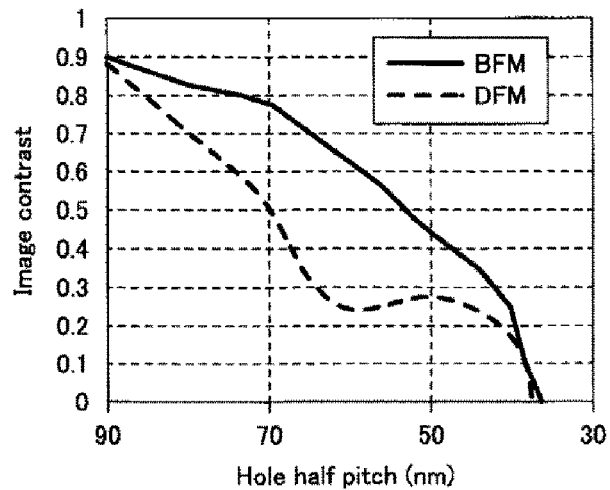
FIG. 2 is a view illustrating the characteristics of a bright field mask and a dark field mask.

First, the exposure mask will be described with reference to FIGS. 1A and 1B, and FIG. 2. FIGS. 1A and 1B are views illustrating an exposure mask. FIG. 1A illustrates a bright field mask (BFM), and FIG. 1B illustrates a dark field mask (DFM). FIG. 2 is a view illustrating the characteristics of the bright field mask and the dark field mask. Specifically, FIG. 2 illustrates a relationship between a half pitch of a hole pattern and an optical image contrast when using the bright field mask (BFM) (solid line), and a relationship between a half pitch of a hole pattern and an optical image contrast when using the dark field mask (DFM) (broken line).

As illustrated in FIG. 1A, the bright field mask 20 has a pattern in which a light-shielding portion 22 opaque to light used for exposure is surrounded by a light-transmitting portion 21 transparent to the light used for exposure.

As illustrated in FIG. 1B, the dark field mask 30 has a pattern in which a light-transmitting portion 31 transparent to the light used for exposure is surrounded by a light-shielding portion 32 opaque to the light used for exposure.

However, when a pattern is formed on a resist film by exposure using an exposure mask, as illustrated in FIG. 2, an optical image contrast obtained using the bright field mask (BFM) as the exposure mask may be more excellent than that obtained using the dark field mask (DFM). Therefore, when forming a minute hole pattern, it is advantageous to use the bright field mask that is excellent in optical image contrast to the dark field mask.

Figure 3:
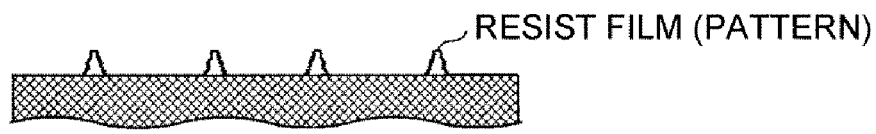
FIG. 3 is a view illustrating an exemplary pattern formed by a DTD method.

However, in the case of forming a minute hole pattern by the DTD method, when the resist film is exposed using the bright field mask as an exposure mask, a negative development is performed, and then a positive development is performed, most of a resist film is removed as illustrated in FIG. 3 such that the pattern scarcely remains. This is because the negative development tends to easily dissolve the intermediate exposed portion as compared with the positive development. FIG. 3 is a view illustrating an exemplary pattern formed by the DTD method.

Therefore, in the pattern forming method of the exemplary embodiment, a resist film is exposed using a bright field mask, and then, a negative development, a modification processing, and then, a positive development are sequentially performed. The modification processing is to reduce the solubility of a sidewall portion of the resist film in a developer which is used in the positive development. This enables a minute hole pattern to be formed.

Figure 4:
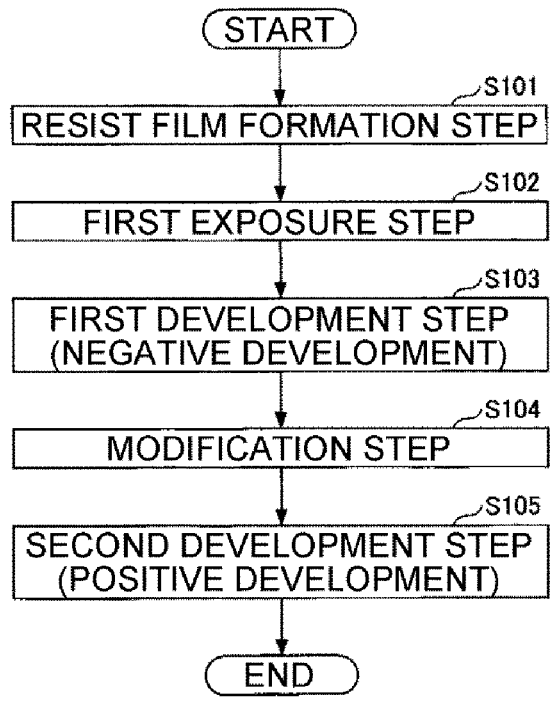
FIG. 4 is a flowchart illustrating a pattern forming method of an exemplary embodiment of the present disclosure.

Hereinafter, descriptions will be made on the pattern forming method of the exemplary embodiment, which is capable of forming a minute hole pattern, in a pattern formation using the DTD method. FIG. 4 is a flowchart illustrating the pattern forming method of the exemplary embodiment.

As illustrated in FIG. 4, the pattern forming method of the exemplary embodiment includes a resist film formation step (step S101), a first exposure step (step S102), a first development step (step S103), a modification step (step S104), and a second development step (step S105).

Hereinafter, respective steps will be described with reference to FIGS. 5A to 9B. FIGS. 5A to 9B are views each illustrating a step of the pattern forming method of the exemplary embodiment. Among the figures, FIGS. 5A, 6A, 7A, 8A, and 9A are schematic plan views in respective steps, and FIGS. 5B, 6B, 7B, 8B, and 9B are schematic cross-sectional views taken along the alternate long and short dash lines A-B in FIGS. 5A, 6A, 7A, 8A, and 9A, respectively.

Figure 5A:
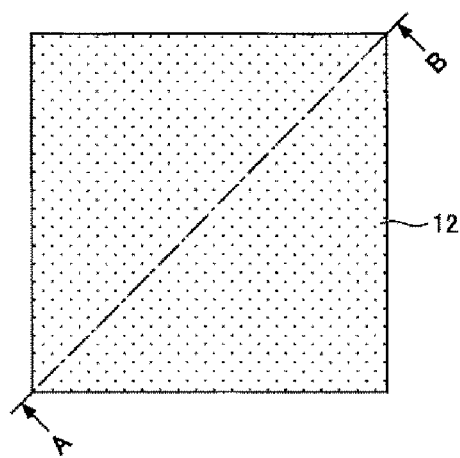
FIGS. 5A and 5B are views illustrating each step of the pattern forming method of the exemplary embodiment of the present disclosure.
Figure 5B:
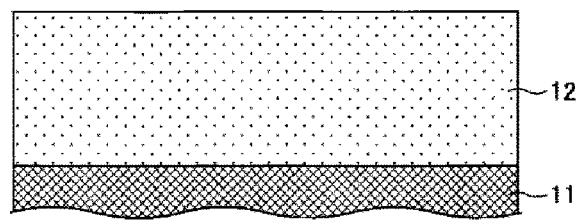

In step 5101, a resist film is formed on a workpiece. Specifically, as illustrated in FIGS. 5A and 5B, a resist film 12 is formed on a workpiece 11 by, for example, spin coating. The workpiece 11 is, for example, a silicon substrate. An anti-reflective film such as, for example, a spin-on-carbon (SOC) or a silicon-containing anti-reflective coating (SiARC) may be formed on the silicon substrate.

The resist film 12 is formed by a chemically amplified photoresist, for example, a KrF resist, an ArF resist, or an extreme ultraviolet (EUV) resist. The resist film 12 includes a base resin and a photo acid generator (PAG). The base resin has a low polar protecting group. Thus, the base resin is suppressed from being dissolved in a developer used for the positive development. The photo acid generator generates acid upon exposure. The protecting group of the base resin is eliminated by chemical reaction with the acid generated from the photo acid generator. When the protecting group of the base resin is eliminated, the polarity of the base resin increases so that the resist film 12 is likely to be dissolved in the developer used for the positive development.

Figure 6A:
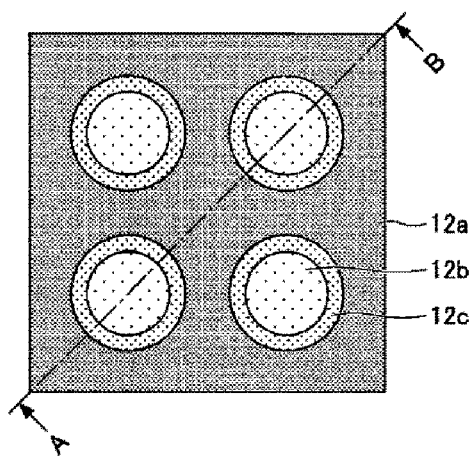
FIGS. 6A and 6B are views illustrating each step of the pattern forming method of the exemplary embodiment of the present disclosure.
Figure 6B:
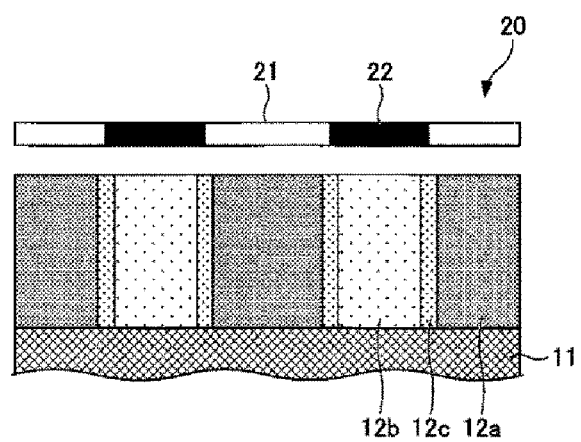

In step S102, the resist film is exposed using a bright field mask. Specifically, as illustrated in FIGS. 6A and 6B, the resist film 12 is exposed using the bright field mask 20 including the light-transmitting portion 21 that is transparent to the light used for the exposure and the light-shielding portion 22 that is opaque to the light used for the exposure, as an exposure mask. Therefore, a region in a lower portion of the light-transmitting portion 21 is exposed so that an exposed portion 12a is formed in the resist film 12 with a large exposed amount. Further, an unexposed portion 12b is left in a lower portion of the light-shielding portion 22 with no exposed amount or a small exposed amount. Further, an intermediate exposed portion 12c is formed between the exposed portion 12a and the unexposed portion 12b with an exposed amount that is smaller than that of the exposed portion 12a and larger than that of the unexposed portion 12b. The intermediate exposed portion 12c is formed by light used for the exposure that goes around from the light-transmitting portion 21. A light source used for the exposure is selected depending on the material of the resist film 12, and may be, for example, a KrF excimer laser (wavelength: 248 nm), an ArF excimer laser (wavelength: 193 nm), or an EUV excimer laser (wavelength: 13.5 nm).

After the resist film 12 is exposed, a post exposure bake (PEB) may be performed to heat the resist film 12.

Figure 7A:
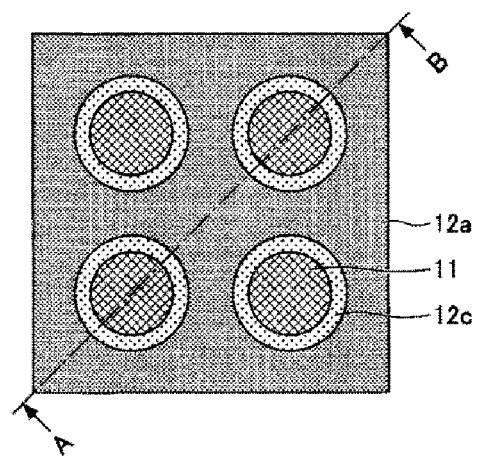
FIGS. 7A and 7B are views illustrating each step of the pattern forming method of the exemplary embodiment of the present disclosure.
Figure 7B:
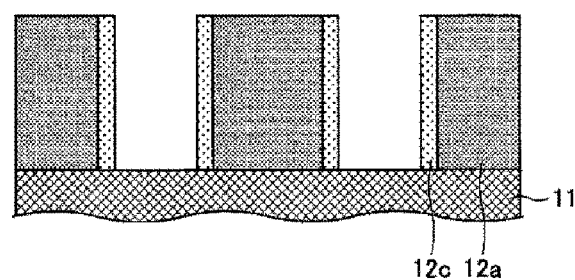

In step S103, the negative development is performed by supplying a first developer to the resist film. Thus, the unexposed portion of the resist film is removed. Specifically, for example, as illustrated in FIGS. 7A and 7B, the resist film 12 is spin-coated with the first developer so that the unexposed portion 12b of the resist film 12 is removed, and the exposed portion 12a and the intermediate exposed portion 12c are left. Therefore, a hole pattern with the unexposed portion 12b opened is formed. The first developer is able to remove the exposed portion 12a of the resist film 12, and examples thereof include a low polar organic solvent such as, for example, butyl acetate (NBA).

Figure 8A:
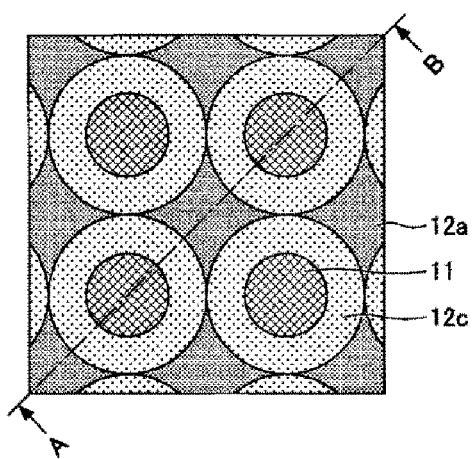
FIGS. 8A and 8B are views illustrating each step of the pattern forming method of the exemplary embodiment of the present disclosure.
Figure 8B:
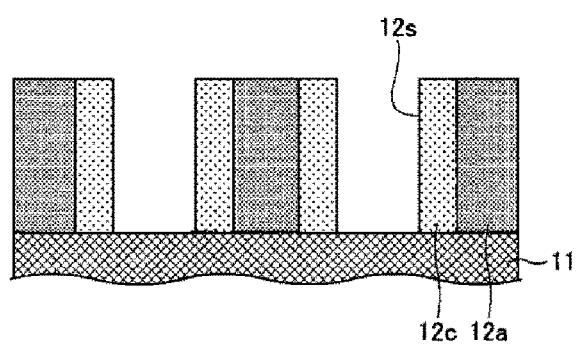

In step S104, the sidewall portion of the resist film is modified. Specifically, as illustrated in FIGS. 8A and 8B, the intermediate exposed portion 12c is expanded by reducing the solubility of the sidewall portion 12s of the resist film 12 in a second developer used for the positive development. The processing of reducing the solubility of the sidewall portion 12s of the resist film 12 in a second developer suppresses the elimination of the protecting group of the base resin by deactivating the acid generated from the photo acid generator contained in the resist film 12 in the exposure step.

The processing of deactivating the acid may be, for example, a processing of causing the sidewall portion 12s of the resist film 12 to react with ammonia ($NH_3$). In addition, the processing may be, for example, a processing of causing the sidewall portion 12s of the resist film 12 to react with an organic base such as, for example, monomethylamine ($CH_3NH_2$), dimethylamine ($(CH_3)_2NH$), or trimethylamine ($(CH_3)_3N$). Further, the processing may be, for example, a processing of causing the sidewall portion 12s of the resist film 12 to react with an amino group-containing silane coupling agent such as, for example, hexamethyldisilazane (HMDS) or trimethylsilyldimethylamine (TMSDMA). In the processing of causing the sidewall portion 12s to react with the amino group-containing silane coupling agent, the acid is deactivated, and water-repellency is obtained. Thus, the solubility in the positive type developer may be particularly reduced. When the sidewall portion 12s of the resist film 12 is reacted with ammonia, the organic base, or the amino group-containing silane coupling agent, the sidewall portion 12s may be exposed to an aqueous solution containing the material (liquid phase reaction) or may be exposed to a gas containing the material (gas phase reaction).

Figure 9A:
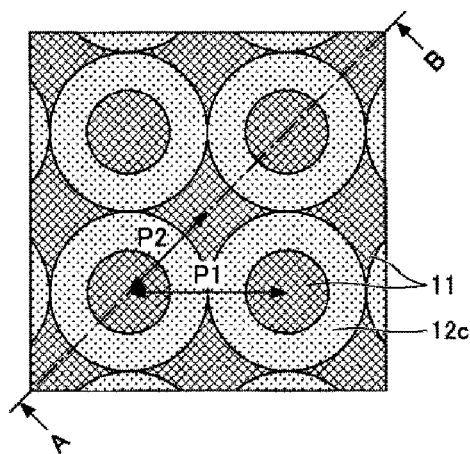
FIGS. 9A and 9B are views illustrating each step of the pattern forming method of the exemplary embodiment of the present disclosure.
Figure 9B:
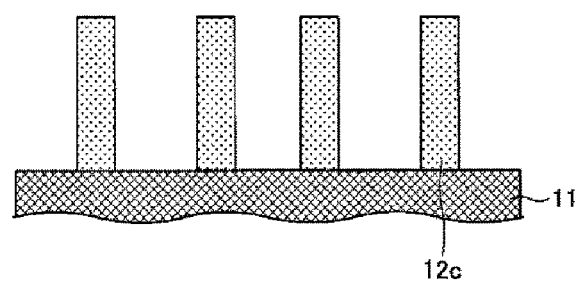

In step S105, the negative development is performed by supplying a second developer to the resist film. Thus, the exposed portion of the resist film is removed. Specifically, for example, as illustrated in FIGS. 9A and 9B, the resist film 12 is spin-coated with the second developer so that the exposed portion 12a of the resist film 12 is removed, and the intermediate exposed portion 12c is left. Therefore, a hole pattern is formed in which the unexposed portion 12b and exposed portion 12a are opened. In this case, in the exemplary embodiment, the solubility of the sidewall portion 12s of the resist film 12 in the second developer is reduced by the modification step. Thus, the sidewall portion 12s of the resist film 12 is readily left, as compared with a case where the modification step is not performed. The second developer is able to remove the unexposed portion 12b of the resist film 12, and is, for example, a high polar alkaline aqueous solution (e.g., tetramethylammonium hydroxide (TMAH)).

A desired hole pattern may be formed by the steps described above.

In the pattern forming method of the exemplary embodiment, the resist film 12 is exposed using the bright field mask 20, and the negative development and the positive development are performed so that the intermediate exposed portion 12c is left, and the exposed portion 12a and the unexposed portion 12b are removed. Accordingly, a hole pattern having a narrower pitch than the pattern of the exposure mask may be formed. Specifically, as illustrated in FIG. 9A, when the pitch of the pattern of the exposure mask is P1, the pitch P2 of the resultant hole pattern is $P1 \times 1/\sqrt{2}$.

Further, in the pattern forming method of the exemplary embodiment, the resist film 12 is exposed by using the bright field mask 20. Accordingly, an excellent optical image contrast is obtained as compared with a case of using a dark field mask. Thus, the resolution performance in forming a minute hole pattern is enhanced.

Further, in the pattern forming method of the exemplary embodiment, after the negative development is performed, the modification processing is performed to reduce the solubility of the sidewall 12s of the resist film 12 in the second developer used for the positive development, and then, the positive development is performed. Therefore, even though the intermediate exposed portion 12c is largely dissolved at the time of the negative development, the sidewall portion 12s of the modified resist film 12 is left at the time of the positive development.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for forming a hole pattern in a resist film, the method comprising:
    forming a resist film on a workpiece;
    exposing the resist film using a bright field mask;
    removing an unexposed portion of the resist film by supplying a first developer to the resist film and performing a negative development after the exposing the resist film;
    modifying a sidewall portion of an intermediate exposed portion formed between the unexposed portion and an exposed portion after the removing the unexposed portion of the resist film; and
    removing the exposed portion of the resist film by supplying a second developer to the resist film and performing a positive development after the modifying the sidewall portion of the resist film,
    wherein the modifying the sidewall portion of the resist film includes a processing of reducing solubility of the sidewall portion of the resist film in the second developer so as to expand the intermediate exposed portion, and
    a pitch of the hole pattern is about $1/\sqrt{2}$ times of a pitch of the bright field mask.

2. The method of claim 1, wherein the modifying the sidewall portion of the resist film includes a processing of causing the sidewall portion of the resist film to react with ammonia.

3. The method of claim 1, wherein the modifying the sidewall portion of the resist film includes a processing of causing the sidewall portion of the resist film to react with an organic base.

4. The method of claim 1, wherein the modifying the sidewall portion of the resist film includes a processing of causing the sidewall portion of the resist film to react with an amino group-containing silane coupling agent.

5. The method of claim 1, further comprising:
heating the resist film between the exposing the resist film and the removing the unexposed portion of the resist film.

6. The method of claim 1, wherein the intermediate exposed portion is formed with the exposed amount that is smaller than that of the exposed portion and larger than that of the unexposed portion.

7. The method of claim 1, further comprising performing a post exposure bake (PEB) to heat the resist film after the exposing the resist film and before the removing the unexposed portion of the resist film.

* * * * *